(12) United States Patent
Mao et al.

(10) Patent No.: US 10,116,303 B2
(45) Date of Patent: Oct. 30, 2018

(54) PARALLEL DEVICES HAVING BALANCED SWITCHING CURRENT AND POWER

(71) Applicants: TOYOTA MOTOR ENGINEERING & MANUFACTURING NORTH AMERICA, INC., Erlanger, KY (US); VIRGINIA TECH INTELLECTUAL PROPERTIES, INC., Blacksburg, VA (US)

(72) Inventors: Yincan Mao, Blacksburg, VA (US); Chi-Ming Wang, Ann Arbor, MI (US); Zichen Miao, Blacksburg, VA (US); Khai Ngo, Blacksburg, VA (US)

(73) Assignees: TOYOTA MOTOR ENGINEERING & MANUFACTURING NORTH AMERICA, INC., Erlanger, KY (US); VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 61 days.

(21) Appl. No.: 15/201,002

(22) Filed: Jul. 1, 2016

(65) Prior Publication Data
US 2018/0006644 A1    Jan. 4, 2018

(51) Int. Cl.
*H03B 1/00*  (2006.01)
*H03K 3/00*  (2006.01)
*H03K 17/687*  (2006.01)

(52) U.S. Cl.
CPC ............... *H03K 17/6871* (2013.01)

(58) Field of Classification Search
CPC .................................. H03K 17/6871
USPC .................................. 327/108–112
See application file for complete search history.

(56) References Cited

U.S. PATENT DOCUMENTS

| | | | |
|---|---|---|---|
| 5,801,580 A * | 9/1998 | Wu | G05F 3/262 327/538 |
| 6,353,353 B1 | 3/2002 | Nakayama | |
| 7,480,163 B2 | 1/2009 | Hashimoto et al. | |
| 8,026,572 B2 * | 9/2011 | Ozeki | H01L 21/8221 257/205 |
| 8,422,255 B2 | 4/2013 | Takao | |
| 8,861,145 B2 | 10/2014 | Marotta et al. | |

(Continued)

OTHER PUBLICATIONS

U.S. Appl. No. 14/724,408, filed May 28, 2015.
U.S. Appl. No. 15/009,867, filed Jan. 29, 2016.

*Primary Examiner* — Metasebia Retebo
(74) *Attorney, Agent, or Firm* — Oblon, McClelland, Maier & Neustadt, L.L.P.

(57) ABSTRACT

A power circuit includes a power source for providing electrical power and two driving transistors being disposed in parallel and receiving electrical power from the power source. Each of the two driving transistors includes a gate terminal, a source connection, and a kelvin source connection. The power circuit also includes a control voltage source having a first terminal and a second terminal. The control voltage source provides a control signal to the two driving transistors for determining driving currents through the two driving transistors. The first terminal is connected to the gate terminals of the two driving transistors, and the second terminal is connected to the kelvin source connections of the two driving transistors. The kelvin source connections of the two driving transistors are inductively coupled.

38 Claims, 5 Drawing Sheets

(56) References Cited

U.S. PATENT DOCUMENTS

| | | | |
|---|---|---|---|
| 9,000,601 B2* | 4/2015 | Azuma | H01L 25/072 257/784 |
| 9,070,562 B2 | 6/2015 | Loechelt et al. | |
| 2001/0040962 A1* | 11/2001 | Pratt | H04M 1/74 379/399.01 |
| 2003/0042939 A1* | 3/2003 | Kato | H02M 1/32 327/108 |
| 2006/0162381 A1* | 7/2006 | Pabich | C03C 14/004 65/17.3 |
| 2012/0235663 A1 | 9/2012 | Bayerer et al. | |
| 2013/0300492 A1 | 11/2013 | Zhao et al. | |
| 2014/0084993 A1* | 3/2014 | Takao | G05F 3/20 327/534 |
| 2014/0124994 A1* | 5/2014 | May | F16F 9/04 267/64.27 |
| 2014/0191371 A1* | 7/2014 | Joseph | H01L 21/30604 257/618 |
| 2015/0372094 A1* | 12/2015 | Horii | H01L 21/76804 257/77 |
| 2016/0043711 A1 | 2/2016 | Cyr et al. | |

* cited by examiner

PARALLEL DEVICES HAVING BALANCED SWITCHING CURRENT AND POWER

BACKGROUND

Solid state power electronics have numerous industry applications such as automotive, illumination, electricity generation, and heavy machinery. These applications may expose the driving solid state power electronics to thousands of amperes of current and/or thousands of volts of voltage. Due to the large amount of driving current/voltage, the materials and designs of power electronics may differ drastically from conventional semiconductor devices. Common device structures include diode, metal-oxide-semiconductor field-effect transistor (MOSFET), bipolar junction transistor (BJT), thyristor, triac, and insulated-gate bipolar transistor (IGBT). Solid state power electronics may be built from semiconductor materials such as silicon, silicon carbide, gallium nitride, or other elemental or compound semiconductor materials.

SUMMARY

Aspects of the disclosure provide a power circuit having a power source for providing electrical power and two driving transistors being disposed in parallel and receiving electrical power from the power source. Each of the two driving transistors includes a gate terminal, a source connection, and a kelvin source connection. The power circuit also includes a control voltage source having a first terminal and a second terminal. The control voltage source provides a control signal to the two driving transistors to activate the two driving transistors. The first terminal is connected to the gate terminals of the two driving transistors, and the second terminal is connected to the kelvin source connections of the two driving transistors. The kelvin source connections of the two driving transistors are inductively coupled.

Aspects of the disclosure provide a voltage supply for providing electrical power, a current source for providing substantially constant current over a predetermined current range, a control voltage source, a first driving transistor having a first gate, a first source connection, and a first kelvin source connection, and a second driving transistor having a second gate, a second source connection, and a second kelvin source connection. The first gate and the first kelvin source connections are electrically connected to the control voltage source, and the second gate and the second kelvin source connections are electrically connected to the control voltage source. The invention includes means for inductively coupling the first and second source connections.

Aspects of the disclosure provide a circuit having a direct current voltage supply, and two driving transistors being disposed in parallel and receiving electrical power from the voltage supply. Each of the two driving transistors includes a gate terminal, a source connection, and a kelvin source connection. The circuit includes a voltage source for providing a control signal to the two driving transistors, and includes a first terminal connected to the gate terminals of the two driving transistors, and a second terminal connected to the kelvin source connections of the two driving transistors. The inductance values of the source connections are configured to improve current balancing of the two driving transistors.

DETAILED DESCRIPTION OF EMBODIMENTS

Figure 1:
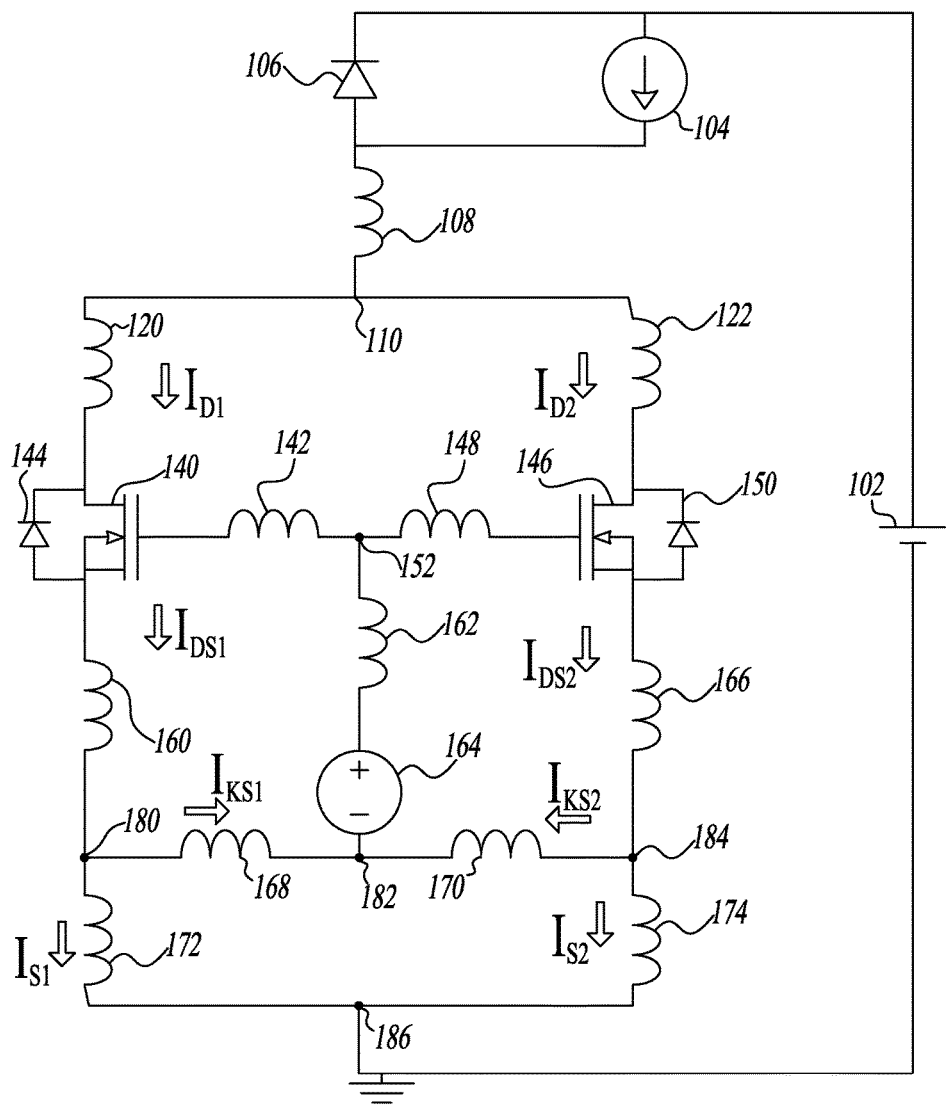
FIG. 1 illustrates an embodiment of a power circuit having balanced parallel devices.

FIG. 1 shows a power circuit 100 having parallel devices. In some implementations, the power circuit 100 includes a voltage source 102 and a current source 104. The voltage 102 supplies electrical energy to the power circuit 100, while the current source 104 provides a substantially constant supply current $I_D$ toward a node 110. A reverse diode 106 provides a current circulating path to emulate load current during turn-off. The supply current $I_D$ may flow from the current source 104 toward a node 110 through a parasitic input inductor 108.

At the node 110, in certain embodiments, the supply current $I_D$ may be divided into drain currents $I_{D1}$, $I_{D2}$, which may be the same or different. Each drain current $I_{D1}$, $I_{D2}$ flows through transistor drain inductors 120, 122, respectively, into parallel driving transistors 140, 146. While the driving transistors 140, 146 are shown as metal-oxide-semiconductor field-effect transistors (MOSFETs) in FIG. 1, other device structures are possible, such as bipolar junction transistor (BJT), thyristor, triac, high-electron-mobility transistor, junction field effect transistor, metal-semiconductor field effect transistor, and insulated-gate bipolar transistor (IGBT). In an exemplary embodiment, the driving transistors 140, 146 are parallel Silicon Carbide (SiC) MOSFETs. Alternatively, the driving transistors 140, 146 may be built from semiconductor materials such as silicon, germanium, gallium nitride, or other elemental or compound semiconductor materials. The driving transistors 140, 146 may be n-type MOSFETs.

In some embodiments, the driving transistors 140, 146 may be disposed on two separate semiconductor substrates. The voltage source 102, a control voltage source 164, and the driving transistors 140, 146 disposed on separate circuit boards and interconnected with wires. Alternatively, the voltage source 102 and the control voltage source 164 may share a single circuit board. The control voltage source 164 may provide a control signal to the driving transistors 140, 146 to activate the driving transistors 140, 146.

In some implementations, the driving transistor 140 may include an intrinsic diode 144, which is a parasitic circuit element formed between the drain terminal and body or source of the driving transistor 140. Similarly, the driving transistor 146 may include an intrinsic diode 150 formed between the drain terminal and body or source of the driving transistor 146.

In exemplary embodiments, the control voltage source 164 is connected to the gate of the driving transistor 140 via an input inductor 162 and a gate inductor 142. Similarly, the control voltage source 164 is connected to the gate of the driving transistor 146 via the input inductor 162 and a gate inductor 148. The gate inductors 142, 148 and the input inductor 162 converge at a node 152.

In certain implementations, a common source current $I_{DS1}$ flows through a common source inductor 160 toward a node 180. At the node 180, the common source current $I_{DS1}$ splits into a source current $I_{S1}$ and a kelvin source current $I_{KS1}$. The source current $I_{S1}$ flows through a source inductor 172 toward a node 186, and the kelvin source current $I_{ks1}$ flows through a kelvin source inductor 168 toward a node 182. Similarly, a common source current $I_{DS2}$ flows through a common source inductor 166 toward a node 184. At the node 184, the common source current $I_{DS2}$ splits into a source current $I_{S2}$ and a kelvin source current $I_{KS2}$. The source current $I_{S2}$ flows through a source inductor 174 toward the node 186, and the kelvin source current $I_{KS2}$ flows through a kelvin source inductor 170 toward the node 182. The node 186 may be grounded. The common source current $I_{DS1}$ may be similar in magnitude as the drain current $I_{D1}$, and the common source current $I_{DS2}$ may be similar in magnitude as the drain current $I_{D2}$.

In some embodiments, some of the inductors in the power circuit 100 may be parasitic inductors. Parasitic inductors may be metallic wires exhibiting inductance in the presence of electrical currents. Some of the inductors in the power circuit 100 may be non-parasitic inductors configured to exhibit a certain inductance value. An exemplary non-parasitic inductor may be an air core inductor or a ferromagnetic core inductor. The inductance value of an inductor may be tuned by changing the number of coils or the ferromagnetic material of the core. Exemplary ferromagnetic materials include elements such as Cobalt, Iron, and Nickel, compounds such as Iron(III) Oxide and Chromium (IV) Oxide, and alloys such as nickel-iron and Heusler alloy. Other ferromagnetic materials may also be used to alter the inductance value of an inductor.

Figure 2:
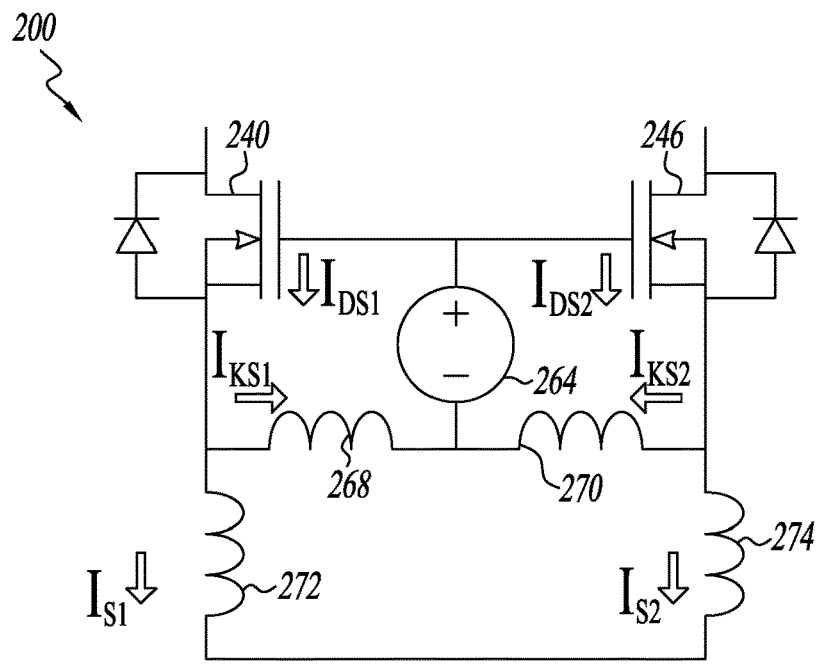
FIG. 2 illustrates an embodiment of the power circuit having balanced parallel devices, where the kelvin source inductors and source inductors are in a parallel configuration.

FIGS. 2-7 illustrate some embodiments of the power circuits for balancing parallel device switching current and power. Certain circuit elements have been removed to simplify the figures. Referring to FIG. 2, the power circuit 200 includes driving transistors 240, 246, a control voltage source 264, kelvin source inductors 268, 270, and source inductors 272, 274. A common source current $I_{DS1}$ is split into a source current $I_{S1}$ and a kelvin source current $I_{ks1}$, and a common source current $I_{DS2}$ is split into a source current $I_{S2}$ and a kelvin source current $I_{ks2}$. A difference in current flowing through the driving transistors 240, 246 may be approximated as:

$$I_{DS1} - I_{DS2} = (I_{S1} - I_{S2}) + (I_{KS1} - I_{KS2}),$$

which can be expressed as:

$$v_{DS1} - v_{DS2} = v_{S2} - v_{S1} = L_S\left(\frac{dI_{S2}}{dt} - \frac{dI_{S1}}{dt}\right) = L_S\left(\frac{dI_{KS2}}{dt} - \frac{dI_{KS1}}{dt}\right),$$

where $v_{DS1}$ and $v_{DS2}$ are drain-to-source voltages across the driving transistors 240, 246, $v_{S1}$ and $v_{S2}$ are the voltages at source terminals of the transistors 240, 246, and $L_S$ is an inductance value of the source inductors 272, 274. The transistors common source current $I_{DS1}$ and $I_{DS2}$ can be approximately as:

$$I_{DS1} = g_{FS}(v_{GS1} - V_{th1}), \text{ and}$$

$$I_{DS2} = g_{FS}(v_{GS2} - V_{th2}),$$

where $g_{FS}$ is the transconductance of the driving transistors 240, 246, $v_{GS1}$ and $v_{GS2}$ are the gate-to-source voltages, and $V_{th1}$ and $V_{th2}$ are the threshold voltages. From the above equation, the difference between the drain-to-source voltages may be expressed as:

$$v_{DS1} - v_{DS2} = v_{S2} - v_{S1} = v_{GS1} - v_{GS2} = V_{th1} - V_{th2}.$$

The difference between the source currents $I_{S1}$ and $I_{S2}$ is:

$$I_{S1} - I_{S2} = \frac{V_{th2} - V_{th1}}{L_S}t$$

and the difference between the kelvin source currents $I_{KS1}$ and $I_{KS2}$ is:

$$I_{KS1} - I_{KS2} = \frac{V_{th2} - V_{th1}}{L_{KS}}t,$$

where $L_{KS}$ is an inductance value of the kelvin source inductors 268, 270. The difference in common source currents $I_{DS1}$ and $I_{DS2}$ may be expressed as a function of the threshold voltages, the kelvin source inductors 268, 270, and the source inductors 272, 274:

$$I_{DS1} - I_{DS2} = (I_{S1} - I_{S2}) + (I_{KS1} - I_{KS2}) = \frac{V_{th2} - V_{th1}}{L_S // L_{KS}}t.$$

Still referring to FIG. 2, in some embodiments, the difference in the common source currents $I_{DS1}$, $I_{DS2}$ may be represented by the expression $$\frac{V_{th2} - V_{th1}}{L_S // L_{KS}}t,$$

which may be reduced by reducing the difference in threshold voltages $V_{th1}$ and $V_{th2}$ or maximizing both $L_S$ and $L_{KS}$. A reduction in the difference in the common source currents $I_{DS1}$, $I_{DS2}$ may improve the balance of switching current and power of the parallel driving transistors 240, 246.

In some embodiments, two transistors with significantly different threshold voltages may be utilized as parallel driving transistors. A screening process to pre-select transistors with similar threshold voltage values may be simplified or even eliminated by balancing the currents of parallel driving transistors using appropriate inductance values.

Figure 3:
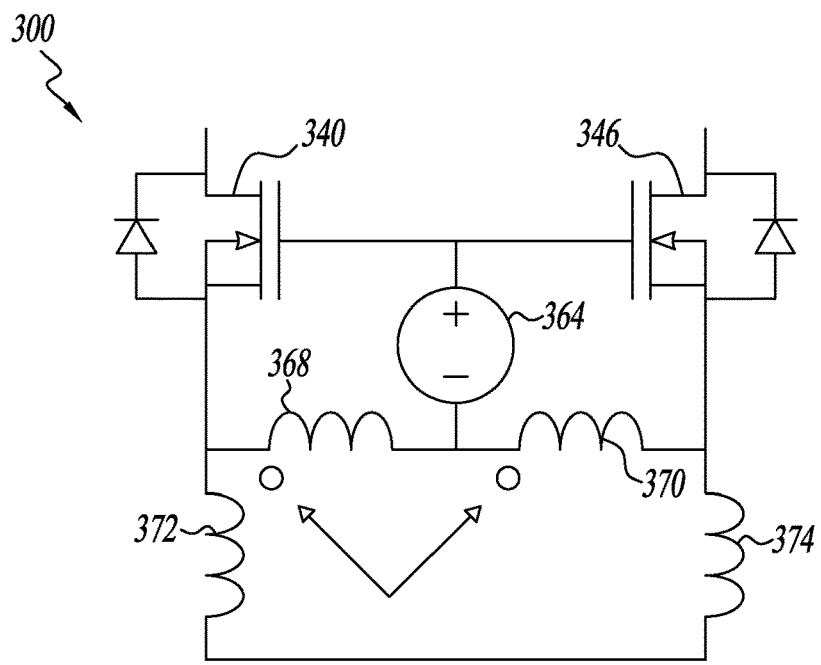
FIG. 3, illustrates another embodiment of the power circuit having balanced parallel devices, where the source inductors are in a parallel configuration with the coupled kelvin source inductors.

Referring now to FIG. 3, which shows an exemplary embodiment of a power circuit 300 having balanced parallel devices. The power circuit 300 includes driving transistors 340, 346, a control voltage source 364, kelvin source inductors 368, 370, and source inductors 372, 374. In certain implementations, the kelvin source inductors 368, 370 may be magnetically coupled. Various methods of magnetic coupling are possible. The kelvin source inductor 368 may be disposed near the kelvin source inductor 370. Alternatively, the inductance values of the kelvin source inductors 368, 370 may be amplified by adding additional inductors in series with the kelvin source inductors 368, 370 or by adding ferromagnetic materials between the kelvin source inductors 368, 370. Other methods are possible.

Still referring to FIG. 3, in some implementations, the difference in the common source currents (not shown) may be represented by the expression $$\frac{V_{th2} - V_{th1}}{L_S // (L_{KS} + M)} t,$$

where $V_{th1}$ and $V_{th2}$ are threshold voltages of driving transistors 340, 346, $L_S$ is an inductance value of the source inductors 372, 374, $L_{KS}$ is an inductance value of the kelvin source inductors 368, 370, t is time, and M is a magnetic coupling term. M, for example, may range from $-L_{KS} < 0 < L_{KS}$. The difference in common source currents may be minimized by reducing the difference in threshold voltages $V_{th1}$ and $V_{th2}$ or maximizing both $L_S$ and $(L_{KS}+M)$. A reduction in the difference in the common source currents may improve the balance of switching current and power of the parallel driving transistors 340, 346.

Figure 4:
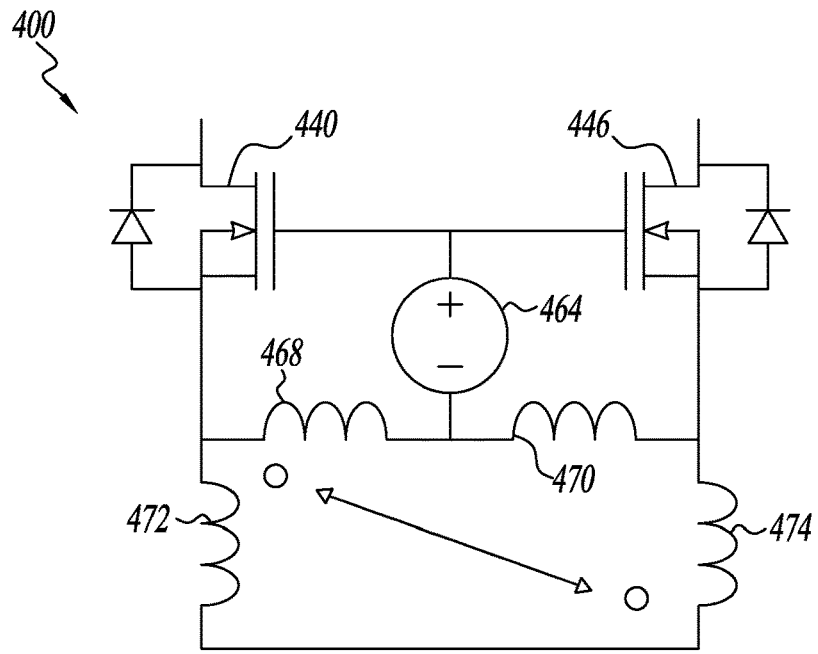
FIG. 4, illustrates yet another embodiment of the power circuit having balanced parallel devices, where the kelvin source inductors are in a parallel configuration with the coupled source inductors.

Referring now to FIG. 4, which shows another exemplary embodiment of a power circuit 400 having balanced parallel devices. The power circuit 400 includes driving transistors 440, 446, a control voltage source 464, kelvin source inductors 468, 470, and source inductors 472, 474. In certain implementations, the source inductors 472, 474 may be magnetically coupled. Various methods of magnetic coupling are possible. The source inductor 472 may be disposed near the source inductor 474. Alternatively, the inductance values of the source inductors 472, 474 may be amplified by adding additional inductors in series with the source inductors 472, 474 or by adding ferromagnetic materials between the source inductors 472, 474. Other methods are possible.

Still referring to FIG. 4, in some implementations, the difference in the common source currents (not shown) may be represented by the expression $$\frac{V_{th2} - V_{th1}}{(L_S + M) // L_{KS}} t,$$

where $V_{th1}$ and $V_{th2}$ are threshold voltages of driving transistors 440, 446, $L_S$ is an inductance value of the source inductors 472, 474, $L_{KS}$ is an inductance value of the kelvin source inductors 468, 470, t is time, and M is a magnetic coupling term. M, for example, may range from $-L_S < 0 < L_S$. The difference in common source currents may be minimized by reducing the difference in threshold voltages $V_{th1}$ and $V_{th2}$ or maximizing both $(L_S+M)$ and $L_{KS}$. A reduction in the difference in the common source currents may improve the balance of switching current and power of the parallel driving transistors 440, 446.

Figure 5:
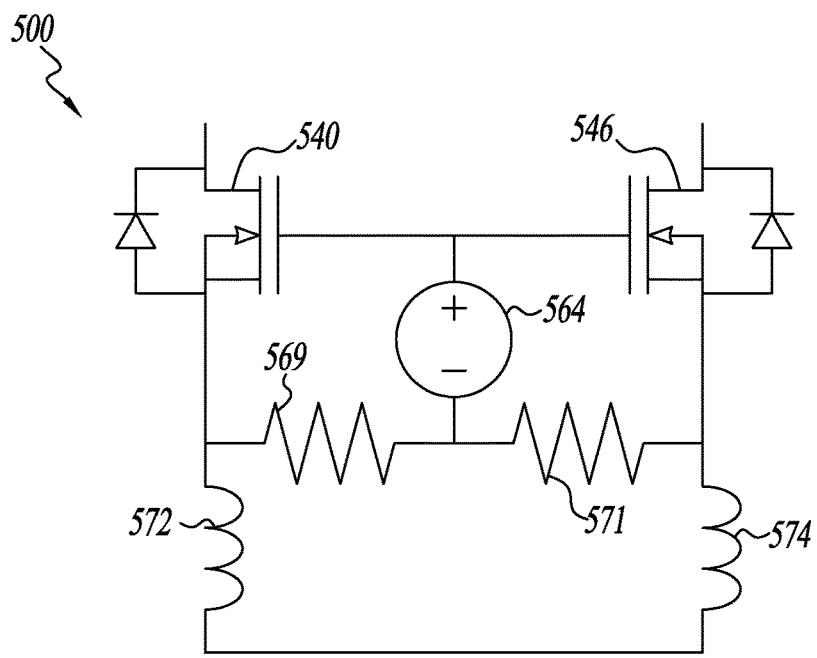
FIG. 5 illustrates still another embodiment of the power circuit having balanced parallel devices, where the kelvin source resistors and source inductors are in a parallel configuration.

Referring now to FIG. 5, which shows a further exemplary embodiment of a power circuit 500 having balanced parallel devices. The power circuit 500 includes driving transistors 540, 546, a control voltage source 564, kelvin source resistors 569, 571, and source inductors 572, 574. In certain implementations, the difference in the common source currents (not shown) may be represented by the expression $$\frac{V_{th2} - V_{th1}}{R_{KS}} + \frac{V_{th2} - V_{th1}}{L_S} t,$$

where $V_{th1}$ and $V_{th2}$ are threshold voltages of driving transistors 540, 546, $L_S$ is an inductance value of the source inductors 572, 574, $R_{KS}$ is a resistance value of the kelvin source resistors 569, 571, and t is time. The difference in common source currents may be minimized by reducing the difference in threshold voltages $V_{th1}$ and $V_{th2}$ or maximizing both $R_{KS}$ and $L_S$. The kelvin source resistors 569, 571 may be parasitic resistors, externally added resistors, or a combination of both. The resistance values of the kelvin source resistors 569, 571 may be increased, for example, by adding a ceramic resistor, a printed carbon resistor, a metal resistor, an alloy resistor, a metal-oxide resistor, or semiconductor resistor to the kelvin source resistors 569, 571. A reduction in the difference in the common source currents may improve the balance of switching current and power of the parallel driving transistors 540, 546.

Figure 6:
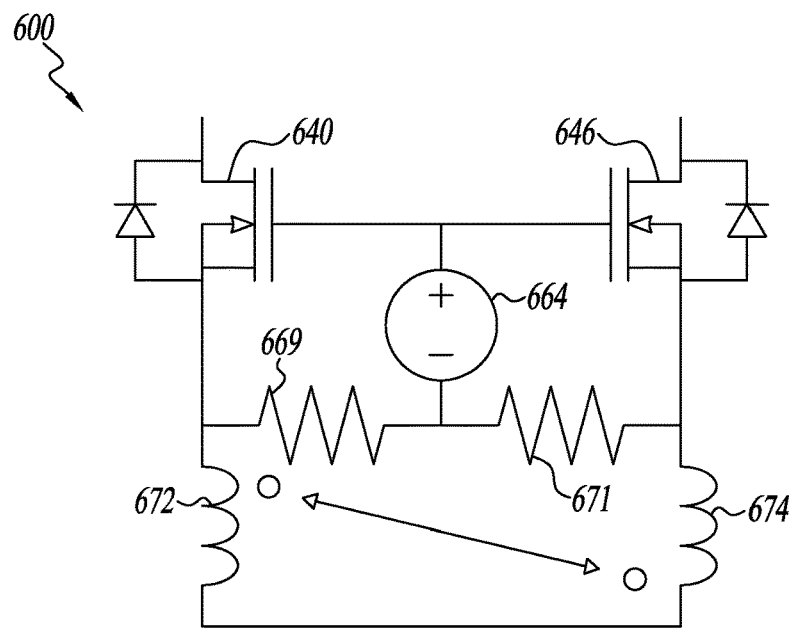
FIG. 6, illustrates an embodiment of the power circuit having balanced parallel devices, where the kelvin source resistors are in a parallel configuration with the coupled source inductors.

Referring now to FIG. 6, which shows yet another exemplary embodiment of a power circuit 600 having balanced parallel devices. The power circuit 600 includes driving transistors 640, 646, a control voltage source 664, kelvin source resistors 669, 671, and source inductors 672, 674. In certain implementations, the source inductors 672, 674 may be magnetically coupled. Various methods of magnetic coupling are possible. The source inductor 672 may be disposed near the source inductor 674. Alternatively, the inductance value of the source inductors 672, 674 may be amplified by adding additional inductors in series with the source inductors 672, 674 or by adding ferromagnetic materials between the source inductors 672, 674. Other methods are possible.

Still referring to FIG. 6, in some implementations, the difference in the common source currents (not shown) may be represented by the expression $$\frac{V_{th2} - V_{th1}}{R_{KS}} + \frac{V_{th2} - V_{th1}}{L_S + M} t,$$

where $V_{th1}$ and $V_{th2}$ are threshold voltages of driving transistors 640, 646, $L_S$ is an inductance value of the source inductors 672, 674, $R_{KS}$ is a resistance value of the kelvin source resistors 669, 671, t is time, and M is a magnetic coupling term. M, for example, may range from $-L_S < 0 < L_S$. The difference in common source currents may be minimized by reducing the difference in threshold voltages $V_{th1}$ and $V_{th2}$ or maximizing both $(L_S+M)$ and $R_{KS}$. The resistance values of the kelvin source resistors 669, 671 may be increased, for example, by adding a ceramic resistor, a printed carbon resistor, a metal resistor, an alloy resistor, a metal-oxide resistor, or semiconductor resistor to the kelvin source resistors 669, 671. A reduction in the difference in the common source currents may improve the balance of switching current and power of the parallel driving transistors 640, 646.

Figure 7:
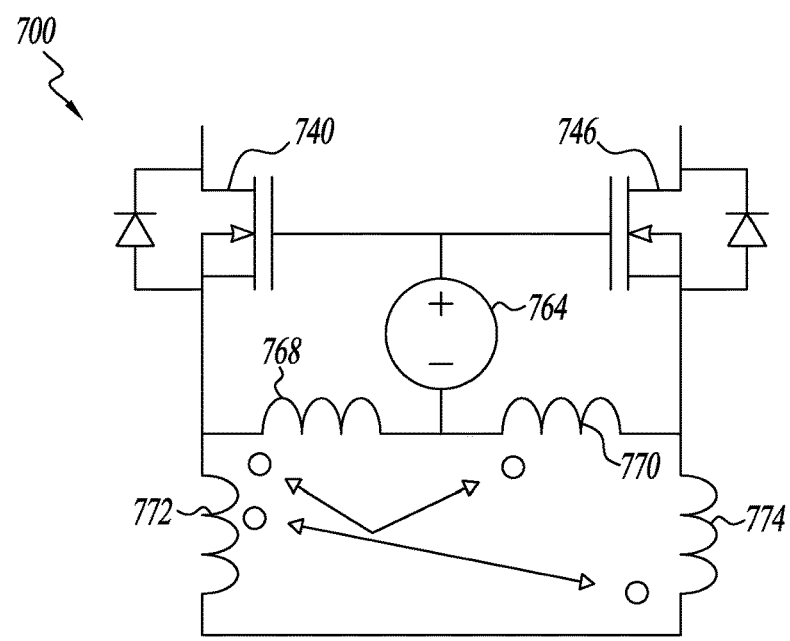
FIG. 7 illustrates another exemplary embodiment of the power circuit having balanced parallel devices, where the parasitic coupled kelvin source inductors and coupled source inductors are in a parallel configuration.

Referring now to FIG. 7, which shows an exemplary embodiment of a power circuit 700 having balanced parallel devices. The power circuit 700 includes driving transistors 740, 746, a control voltage source 764, kelvin source inductors 768, 770, and source inductors 772, 774. In certain implementations, the source inductors 772, 774 may be magnetically coupled and the kelvin source inductors 768, 770 may be magnetically coupled. Various methods of magnetic coupling are possible. The source inductor 772 may be disposed near the source inductor 774. Alternatively, the inductance values of the source inductors 772, 774 may be amplified by adding additional inductors in series with the source inductors 772, 774 or by adding ferromagnetic materials between the source inductors 772, 774. Similarly, the kelvin source inductor 768 may be disposed near the source inductor 770. Alternatively, the inductance values of the kelvin source inductors 768, 770 may be amplified by adding additional inductors in series with the kelvin source inductors 768, 770 or by adding ferromagnetic materials between the kelvin source inductors 768, 770. Other methods are possible.

Still referring to FIG. 7, in some implementations, the difference in the common source currents (not shown) may be represented by the expression $$\frac{V_{th2} - V_{th1}}{(L_S + M_S) // (L_{KS} + M_{KS})} t,$$

where $V_{th1}$ and $V_{th2}$ are threshold voltages of driving transistors 740, 746, $L_S$ is an inductance value of the source inductors 772, 774, $L_{KS}$ is an inductance value of the kelvin source inductors 768, 770, t is time, $M_S$ is a source magnetic coupling term, and $M_{KS}$ is a kelvin source magnetic coupling term. $M_S$, for example, may range from $-L_S<0<L_S$ and $M_{KS}$ may range from $-L_{KS}<0<L_{KS}$. The difference in common source currents may be minimized by reducing the difference in threshold voltages $V_{th1}$ and $V_{th2}$ or maximizing both $(L_S+M)$ and $(L_{KS}+M)$. A reduction in the difference in the common source currents may improve the balance of switching current and power of the parallel driving transistors 740, 746.

While FIGS. 1-7 illustrate embodiments of power circuits having two parallel driving transistors, more parallel driving transistors may be included in the power circuits. The methods described above for balancing parallel transistors switching current are similarly applicable to power circuits having more than two parallel driving transistors.

Figure 8:
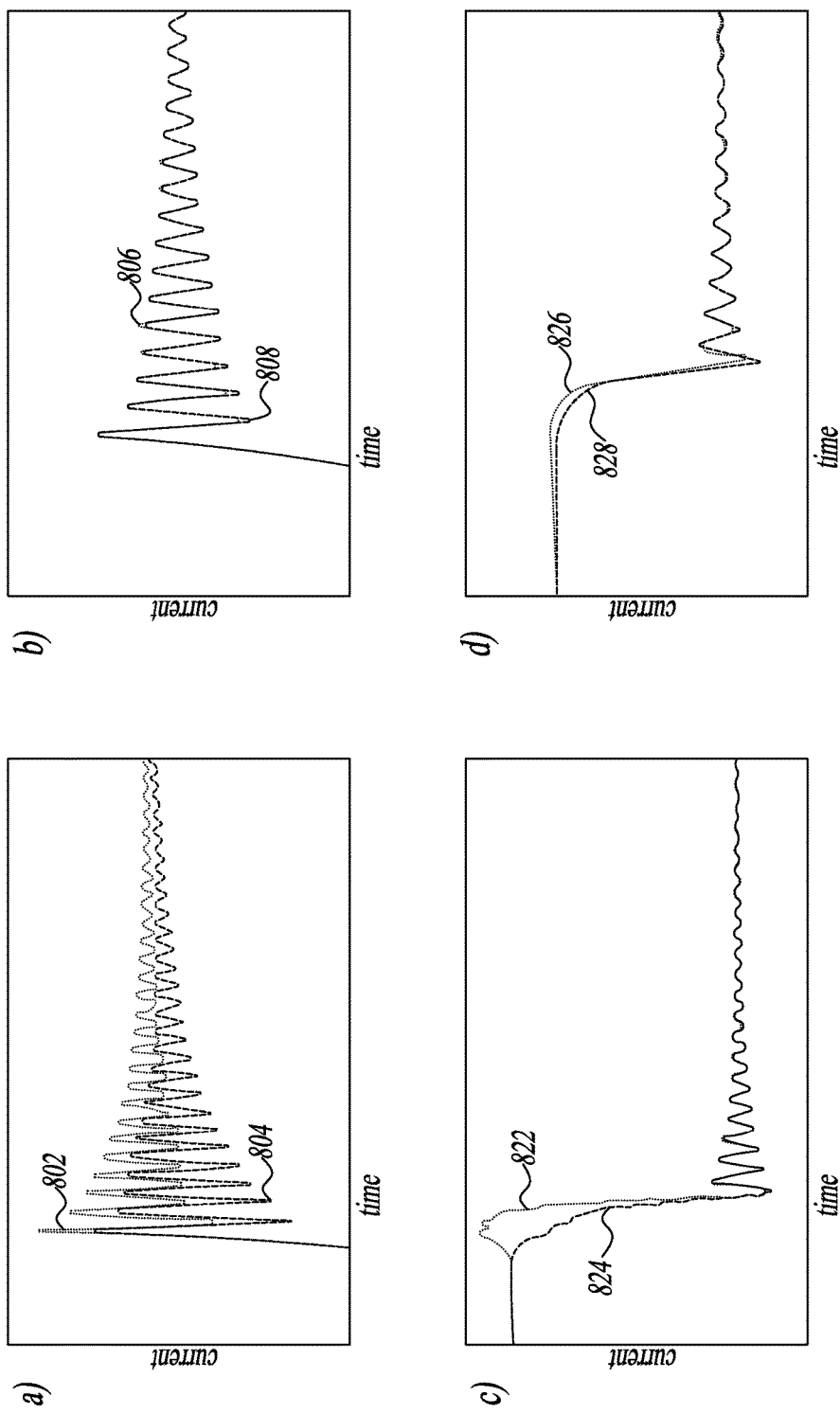
FIGS. 8a-d illustrate turn-on (a and b) and turn-off (c and d) behaviors of power circuits with (b and d) and without (a and c) balanced parallel devices.

Referring now to FIGS. 8a-d, which illustrate turn-on (8a and 8b) and turn-off (8c and 8d) behaviors of power circuits with (8b and 8d) and without (8a and 8c) balanced parallel devices. In exemplary implementations, curves 802, 804 in FIG. 8a may represent turn-on behaviors of unbalanced parallel transistors. Curves 806, 808 in FIG. 8b show turn-on behaviors of balanced parallel transistors. Turning to FIG. 8c, curves 822, 824 may represent turn-off behaviors of unbalanced parallel transistors. In FIG. 8d, curves 826, 828 show turn-off behaviors of balanced parallel transistors.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes and algorithms described herein may be performed in hardware or software executed by hardware, including computer processors and/or programmable circuits configured to execute program code and/or computer instructions to execute the functions, processes and algorithms described herein. Additionally, some implementations may be performed on modules or hardware not identical to those described. Accordingly, other implementations are within the scope that may be claimed.

The invention claimed is:

1. A system comprising:
   a power source that provides electrical power;
   two driving transistors disposed in parallel and receiving electrical power from the power source, wherein each of the two driving transistors includes a gate terminal, a source connection, and a kelvin source connection; and
   a control voltage source having a first terminal and a second terminal, wherein:
      the control voltage source provides a control signal to the two driving transistors to activate the two driving transistors,
      the first terminal is connected to the gate terminal of a first of the two driving transistors via a common inductor and a first inductor,
      the first terminal is connected to the gate terminal of a second of the two driving transistors via the common inductor and a second inductor, and
      the second terminal is connected to the kelvin source connections of the two driving transistors;
   wherein the kelvin source connections of the two driving transistors are inductively coupled.

2. The circuit of claim 1, wherein the kelvin source connections are inductively coupled by inserting a coil inductor in series with at least one of the kelvin source connections.

3. The circuit of claim 1, further comprising a ferromagnetic material disposed in between the kelvin source connections.

4. The circuit of claim 1, wherein the source connections of the two driving transistors are inductively coupled.

5. The circuit of claim 4, wherein the source connections are inductively coupled by inserting a coil inductor in series with at least one of the source connections.

6. The circuit of claim 4, further comprising a ferromagnetic material disposed in between the source connections.

7. A power circuit, comprising:
   a voltage supply that provides electrical power;
   a current source that provides substantially constant current over a predetermined current range;
   a control voltage source;
   a first driving transistor having a first gate, a first source connection, and a first kelvin source connection, wherein the first gate and the first kelvin source connection are electrically connected to the control voltage source;
   a second driving transistor having a second gate, a second source connection, and a second kelvin source connection, wherein the second gate and the second kelvin source connection are electrically connected to the control voltage source; and
   an inductive coupling circuit to inductively couple the first and second source connections,
   wherein the control voltage source includes at least a first terminal coupled to the first gate via a common inductor and a first inductor, and coupled to the second gate via the common inductor and a second inductor.

8. The power circuit of claim 7, further comprising means for inductively coupling the first and second kelvin source connections.

9. The power circuit of claim 7, wherein the means for inductively coupling the first and second source connections includes a coil inductor disposed in series with at least one of the first or second source connections.

10. The power circuit of claim 7, further comprising a kelvin source resistor disposed in series with at least one of the first or second kelvin connection.

11. The power circuit of claim 10, wherein the kelvin source resistor is selected from the group consisting of a ceramic resistor, a printed carbon resistor, a metal resistor, an alloy resistor, a metal-oxide resistor, or semiconductor resistor.

12. The power circuit of claim 7, wherein the first and second driving transistors are silicon carbide transistors.

13. The power circuit of claim 7, wherein the first and second driving transistors are disposed on at least two semiconductor substrates.

14. A circuit comprising
a direct current voltage supply;
two driving transistors disposed in parallel and receiving electrical power from the voltage supply, each of the two driving transistors includes a gate terminal, a source connection, and a kelvin source connection; and
a voltage source that provides a control signal to the two driving transistors, including:
a first terminal connected to the gate terminal of a first one of the two driving transistors via a common inductor and a first inductor,
the first terminal is connected to the gate terminal of a second of the two driving transistors via the common inductor and a second inductor, and
a second terminal connected to the kelvin source connections of the two driving transistors;
wherein inductances of the source connections are configured to improve current balancing of the two driving transistors.

15. The circuit of claim 14, wherein inductances of the kelvin source connections are configured to improve current balancing of the two driving transistors.

16. The circuit of claim 14, wherein resistances of the kelvin source connections are configured to improve the current balancing of the two driving transistors.

17. The circuit of claim 14, further comprising a ferromagnetic material disposed in between at least a portion of the source connections.

18. The circuit of claim 14, further comprising an external inductor added to at least one of the source connections.

19. The circuit of claim 14, wherein the two driving transistors are fabricated on two separate silicon carbide substrates.

20. A circuit for driving parallel transistors, comprising
a voltage supply;
at least two power transistors disposed in parallel and receiving electrical energy from the voltage supply, each of the at least two power transistors includes a gate terminal, a source connection, and a kelvin source connection; and
a voltage source that controls an operation of the at least two power transistors, including:
a first terminal electrically coupled to the gate terminal of a first of the at least two power transistors via a common inductor and a first inductor,
the first terminal is electrically coupled to the gate terminal of a second one of the at least two power transistors via the common inductor and a second inductor, and
a second terminal electrically coupled to the kelvin source connections of the at least two power transistors;
wherein inductances of the kelvin source connections are configured to improve current balancing of the at least two power transistors.

21. The circuit of claim 20, wherein inductances of the source connections are configured to improve current balancing of the at least two power transistors.

22. The circuit of claim 20, further comprising a ferromagnetic material disposed in between at least a portion of the kelvin source connections.

23. The circuit of claim 20, further comprising an external inductor added to at least one of the kelvin source connections.

24. The circuit of claim 20, wherein the at least two power transistors are fabricated on at least two silicon carbide substrates.

25. The circuit of claim 20, wherein the kelvin source connections are inductively coupled.

26. A system comprising:
two power transistors disposed in parallel, wherein each of the two driving transistors includes a gate terminal, a source connection, and a kelvin source connection;
a power source that provides electrical energy to the two power transistors; and
a control voltage having a first terminal and a second terminal, wherein the control voltage source provides at least a control signal to the gate terminals of the two power transistors to activate the two power transistors;
wherein resistances of the kelvin source connections are configured to reduce a difference in drain currents of the two power transistors; and
wherein the first terminal of the control voltage source is connected to the gate terminal of a first of the two power transistors via a common inductor and a first inductor, and is connected to the gate of a second of the two power transistors via the common inductor and a second inductor.

27. The system of claim 26, wherein each kelvin source connection of the two power transistors includes a kelvin source resistor.

28. The system of claim 27, wherein each kelvin source resistor is from the group consisting of a ceramic resistor, a printed carbon resistor, a metal resistor, an alloy resistor, a metal-oxide resistor, or semiconductor resistor.

29. The system of claim 26, wherein at least one of the source connections includes a coil inductor.

30. The system of claim 29, further comprising a ferromagnetic material disposed within a core of the coil inductor.

31. The system of claim 26, wherein the two power transistors are silicon carbide transistors.

32. The system of claim 26, wherein the two power transistors are bipolar junction transistors.

33. A circuit, comprising:
a voltage supply that provides electrical power to the circuit;
a current source that provides substantially constant current over a predetermined current range;
a control voltage source;
a first power transistor having a first gate, a first source inductor, and a first kelvin source resistor, wherein the first gate and the first kelvin source resistor are electrically coupled to the control voltage source; and
a second power transistor having a second gate, a second source inductor, and a second kelvin source resistor, wherein the second gate and the second kelvin source resistor are electrically coupled to the control voltage source;

wherein resistances of the first and second kelvin source resistors and inductances of the first and second source inductors are configured to reduce a difference in drain currents of the first and second power transistors, and the control voltage source is coupled to the first gate via a common inductor and a first inductor, and is coupled to the second gate via the common inductor and a second inductor.

34. The circuit of claim 33, wherein the first and second source inductors are magnetically coupled.

35. The circuit of claim 34, further comprising a first ferromagnetic core disposed within the first source inductor and a second ferromagnetic core disposed within the second source inductor.

36. The circuit of claim 35, wherein the first and second ferromagnetic cores include elemental, compound, or alloy ferromagnetic materials.

37. The circuit of claim 33, wherein the first and second power transistors are disposed on two different silicon carbide substrates.

38. The circuit of claim 33, wherein the first and second power transistors are metal-oxide-semiconductor field-effect transistors.

* * * * *